US012238880B2

(12) United States Patent
Yen et al.

(10) Patent No.: US 12,238,880 B2
(45) Date of Patent: Feb. 25, 2025

(54) RETRACTABLE SCREEN MOBILE DEVICE

(71) Applicant: SYNCMOLD ENTERPRISE CORP., New Taipei (TW)

(72) Inventors: Ching-Hui Yen, New Taipei (TW); Chun-Hao Huang, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 197 days.

(21) Appl. No.: 18/072,204

(22) Filed: Nov. 30, 2022

(65) Prior Publication Data

US 2023/0209745 A1    Jun. 29, 2023

Related U.S. Application Data

(60) Provisional application No. 63/293,457, filed on Dec. 23, 2021.

(30) Foreign Application Priority Data

Sep. 5, 2022 (TW) ................... 111209659

(51) Int. Cl.
*H05K 5/02* (2006.01)
*H04M 1/02* (2006.01)

(52) U.S. Cl.
CPC ........ *H05K 5/0217* (2013.01); *H04M 1/0268* (2013.01)

(58) Field of Classification Search
CPC .............. H05K 5/0217; H04M 1/0268; H04M 1/0237; G06F 1/1624; G06F 1/1652; G09F 9/301
See application file for complete search history.

(56) References Cited

U.S. PATENT DOCUMENTS

| 11,647,597 | B2 * | 5/2023 | Liu ...................... | H04M 1/0235 |
| | | | | 361/807 |
| 2021/0218835 | A1 * | 7/2021 | Song ...................... | G06F 1/1652 |
| 2021/0223820 | A1 * | 7/2021 | Yoo ........................ | G06F 1/1681 |
| 2022/0418125 | A1 * | 12/2022 | Li ........................... | G06F 1/1652 |
| 2023/0145655 | A1 * | 5/2023 | Shin ...................... | G06F 1/1624 |
| | | | | 361/807 |
| 2024/0023259 | A1 * | 1/2024 | Han ...................... | G06F 1/1686 |

FOREIGN PATENT DOCUMENTS

KR    20170025520 A  *  3/2017  ............... G09F 9/30

OTHER PUBLICATIONS

Lee Yu Gu; Roh Ki Chang, "Potable Device having a Roller ble display", Mar. 8, 2017, Entire Document (Translation of KR 20170025520). (Year: 2017).*

* cited by examiner

*Primary Examiner* — Stephen S Sul

(74) *Attorney, Agent, or Firm* — Muncy, Geissler, Olds & Lowe, P.C

(57) ABSTRACT

A retractable screen mobile device comprises a main unit, a retractable unit, an elastic element, a constant force spring, and a flexible display screen. When the retractable unit is in a retracted state, the flexible display screen is supported by a first supporting surface of the main unit; when the retractable unit is in an outstretched state, the flexible display screen is supported by the first supporting surface of the main unit and a second supporting surface of the retractable unit.

13 Claims, 10 Drawing Sheets

RETRACTABLE SCREEN MOBILE DEVICE

CROSS-REFERENCE TO RELATED APPLICATION

This application claims the benefit of U.S. Provisional Application Ser. No. U.S. 63/293,457 filed on Dec. 23, 2021, and the benefit of Taiwan Patent Application Serial No. 111209659 filed on Sep. 5, 2022. The entirety of each Application is incorporated herein by reference.

BACKGROUND OF THE INVENTION

1. Field of the Invention

The present invention relates to a retractable screen mobile device especially a retractable screen mobile device for a flexible display screen.

2. Description of Related Art

Conventional mobile devices often focus on the requirements of lightness and thinness. As a result, the size of the display screen of the mobile device is limited. However, with the development of mobile devices, users' demand for large-size display screens has increased rapidly. Therefore, many related products that can expand the size of the display screen have been published in recent years, that is, the display screen area can be increased when the mobile device is used but still meet the requirements of light and thin when the mobile device is carried and stored.

However, during the transition between the unfolded and retracted states of the foldable flexible display screen, the tensile stress generated or material fatigue may easily lead to creases, damages, or cracks in the flexible display screen.

Therefore, the main objective of the present invention is to provide a mobile device with a retractable display screen, which can be selectively switched between the outstretched and retracted states according to the needs when in use.

SUMMARY OF THE INVENTION

An objective of the present invention is to provide a retractable screen mobile device, wherein the retractable screen mobile device comprises a main unit, including a first shell, a first supporting plate, and an accommodating space, wherein the first supporting plate is disposed on the first shell and having a first supporting surface, and the accommodating space is surrounded and defined by the first shell and the first supporting plate; a retractable unit, slidably disposed on the main unit along a telescopic axis and converted between a retracted state and an outstretched state with respect to the main unit, the retractable unit includes a second shell, a pivot, and a second supporting plate, wherein the pivot is disposed on one side of the second shell away from the first shell, the second supporting plate is pivotably hung on the pivot and has a second supporting surface, the second supporting plate switched between a inclined position and a aligned position with respect to the pivot; an elastic element with two ends separately disposed on the main unit and the retractable unit; a constant force spring, including a winding part and a telescopic part, wherein the winding part is disposed on the first shell; and a flexible display screen, including a fixed end and a free end, wherein the fixed end is disposed on the first supporting plate, the flexible display screen covers the first supporting surface and turn around the pivot, the free end is fixed to the telescopic part of the constant force spring, wherein the constant force spring provides constant tension on the flexible display screen; wherein the pivot and the first shell are closest to each other when the retractable unit is in the retracted state; the pivot and the first shell are farthest away from each other when the retractable unit is in the outstretched state.

In one embodiment, when the retractable unit is in the retracted state, the second supporting plate is in the inclined position and partially obliquely inserted in the accommodating space and partially overlapped with the first supporting plate, the first supporting surface and the second supporting surface are not coplanar, the flexible display screen is mainly supported by the first supporting surface; when the retractable unit is in the outstretched state, the first supporting plate and the second supporting plate do not overlap to each other, the first supporting surface and the second supporting surface substantially coplanar, the flexible display screen is jointly supported by the first supporting surface and the second supporting surface.

In one embodiment, the first supporting plate further has a first inner surface and a first inclined surface, wherein the first inner surface is opposite to the first supporting surface, and the first inclined surface connects the first supporting surface and the first inner surface; the second supporting plate has at least a hook part, a second inner surface, and a second inclined surface, wherein the hook part is hung on the pivot so that the second supporting plate can rotate relative to the pivot, the second inner surface is opposite to the second supporting surface, and the second inclined surface connects the second supporting surface and the second inner surface, the first inclined surface and the second inclined surface are matched and substantially abutted with each other when the retractable unit is in the outstretched state.

In one embodiment, a first inner acute angle is formed between the first supporting surface and the first inclined surface; a first inner obtuse angle is formed between the first inner surface and the first inclined surface; a second inner obtuse angle is formed between the second supporting surface and the second inclined surface, and a second inner acute angle is formed between the second inner surface and the second inclined surface.

In one embodiment, the elastic element includes a first end and a second end, wherein the first end is fixed to the first shell, and the second end is fixed to the retractable unit and tends to keep the retractable unit in the outstretched state.

In one embodiment, the flexible display screen includes a fixed display area and an extended display area, wherein the fixed display area is constantly supported by the first supporting surface, the extended display area is partially supported by the second supporting surface and partially wound around the pivot when the retractable unit is in the outstretched state, and the extended display area is partially wound around the pivot and partially accommodated in the accommodating space when the retractable unit is in the retracted state.

In one embodiment, the retractable screen mobile device further comprises a locking element, when the locking element is in a locked state, the retractable unit is kept in the retracted state, and when the locking element is in an unlocked state, the elastic element pushes the retractable unit so that the retractable unit tends to remain in the outstretched state.

In one embodiment, the locking element includes a hook, a tenon, and a button, wherein the hook is attached to the second shell, the tenon and the button are disposed on the first shell; the hook and the tenon are engaged with each other in the locked state, and the hook and the tenon are separated and switched to the unlocked state when the button is pressed.

In one embodiment, the pivot has a rod body and at least one hook groove, the rod body extends along a steering axis substantially perpendicular to the telescopic axis, the at least one hook groove is formed on the rod body and the hook part is correspondingly hung on the at least one hook groove.

In one embodiment, when the second supporting plate is in the inclined position, a main angle is formed between the first supporting surface and the first supporting surface, wherein the main angle ranges from 5 to 20 degrees.

In one embodiment, the elastic element is a torsion spring with two ends respectively disposed on the first shell and the second shell.

In one embodiment, the pivot is a damping shaft that provides a damping force when the retractable unit moves relative to the main unit.

In one embodiment, the damping shaft has a hollow outer tube, an inner tube, a filling area, a damping oil, and two oil seals, wherein the inner tube passes through the hollow outer tube and two ends of the inner tube are respectively fixed on the second shell, the hollow outer tube rotates relative to the inner tube, the filling area is sandwiched between the hollow outer tube and the inner tube, the damping oil is filled in the filling area, and the two oil seals are respectively disposed at both ends of the filling area to seal the damping oil in the filling area.

DETAILED DESCRIPTION OF THE PREFERRED EMBODIMENT

Figure 1:
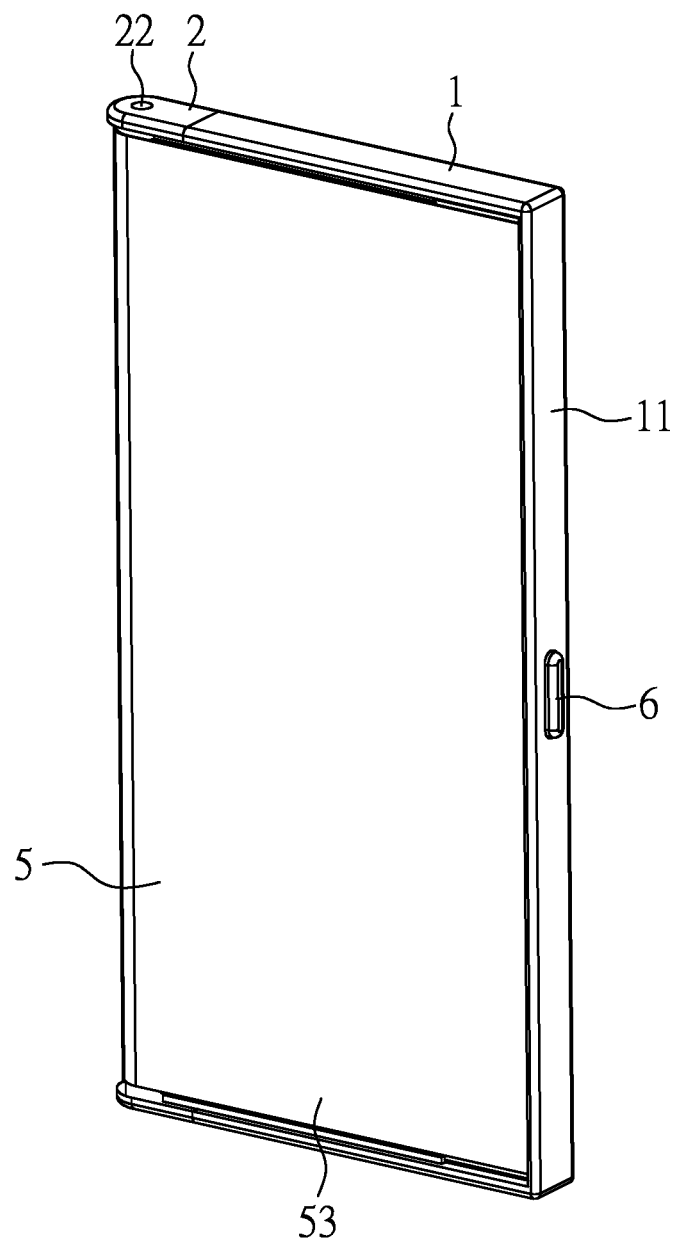
FIG. 1 is a schematic view of the retractable screen mobile device in the retracted state according to the present invention.

Reference will now be made in detail to the present embodiments of the invention, examples of which are illustrated in the accompanying drawings, and are not intended to limit the present invention, applications or implementations described in these embodiments. Wherever possible, the same reference numbers are used in the drawings and the description to refer to the same or like parts. It shall be appreciated that, in the following embodiments and the attached drawings, elements unrelated to the present invention are omitted from depiction; and dimensional relationships among individual elements in the attached drawings are provided only for ease of understanding, but not to limit the actual scale.

Figure 2:
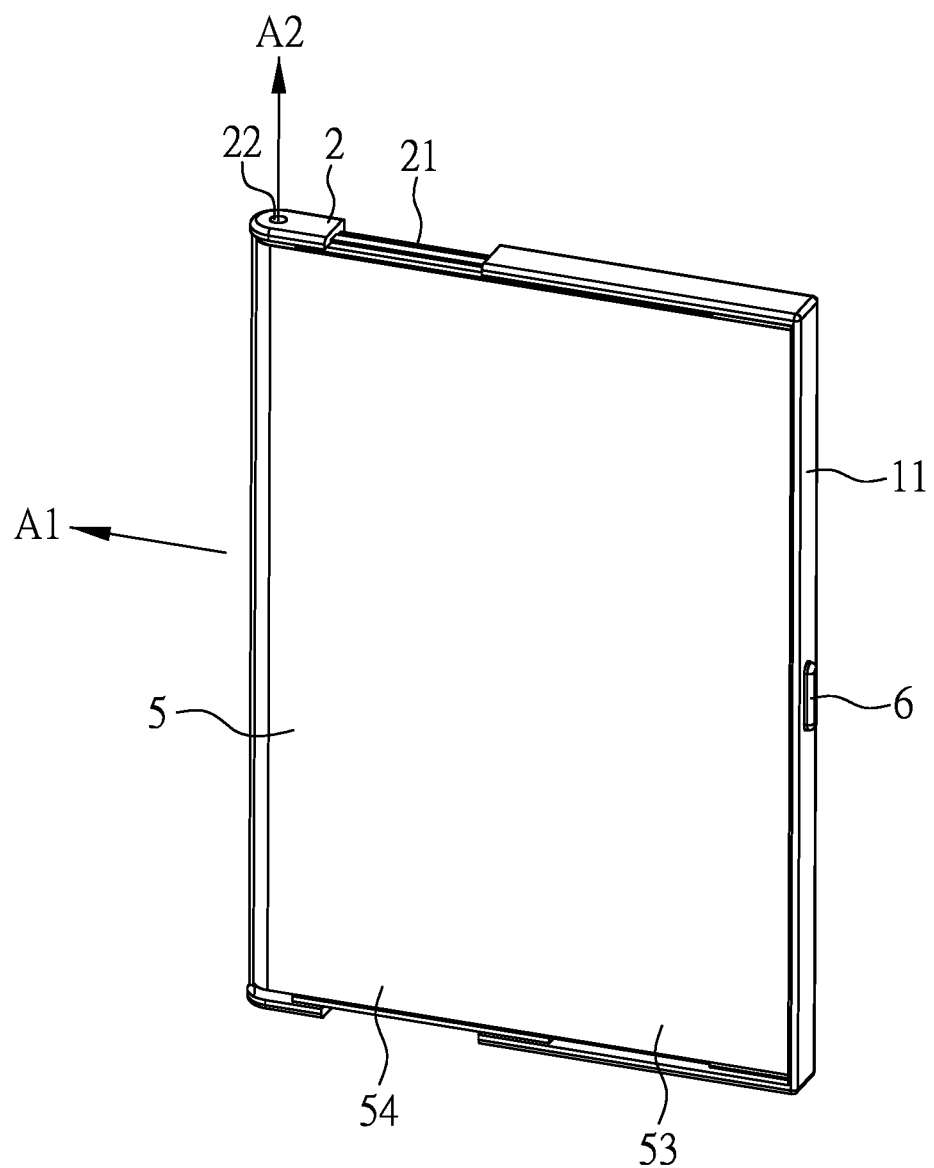
FIG. 2 is a schematic view of the retractable screen mobile device in the outstretched state according to the present invention.
Figure 3:
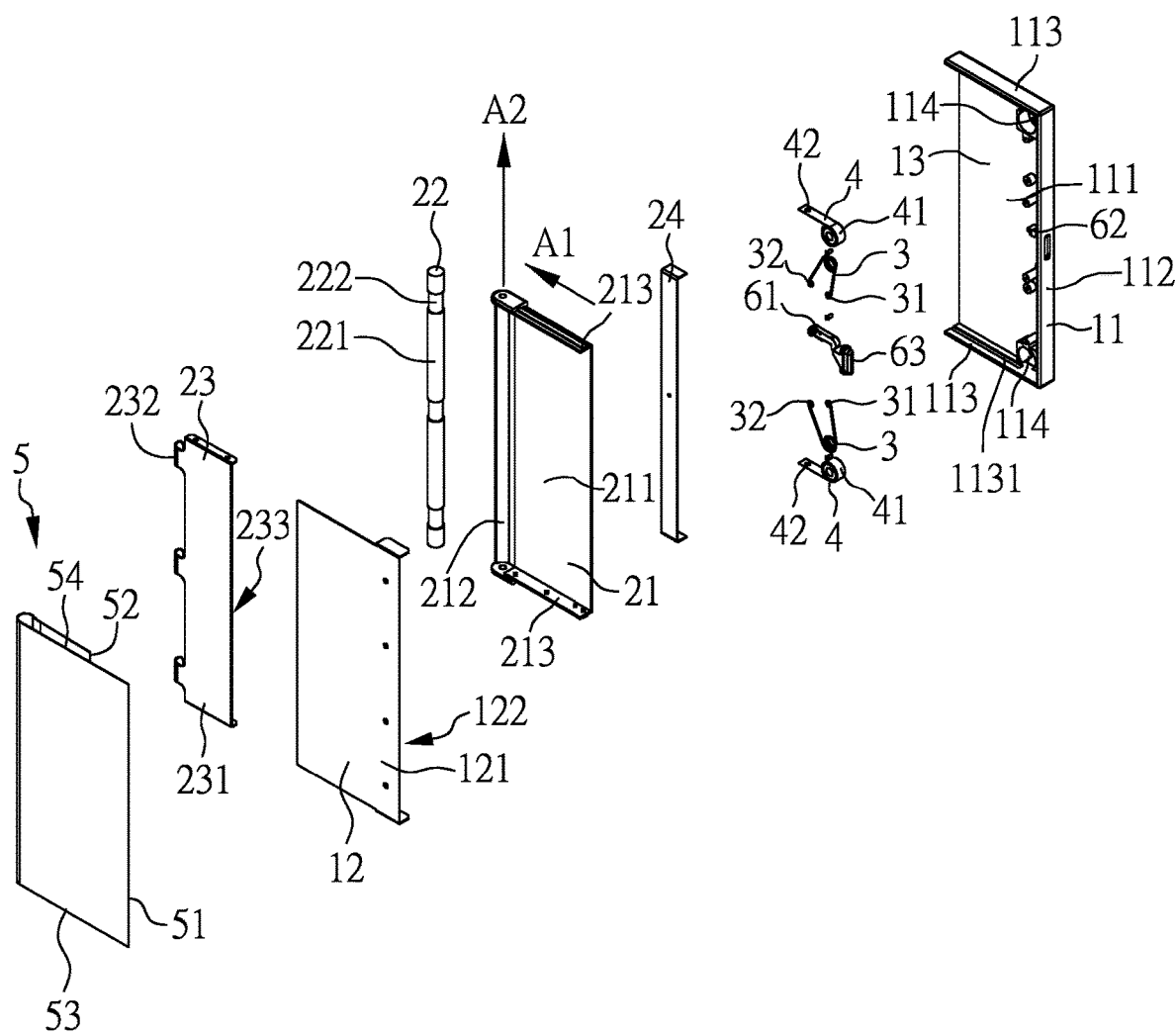
FIG. 3 is an exploded view of the retractable screen mobile device according to the present invention.

The schematic diagrams of the retractable screen mobile device 1000 of the present invention in the retracted state and the outstretched state are shown in FIG. 1 and FIG. 2 respectively, and the exploded view is shown in FIG. 3. The retractable screen mobile device 1000 mainly includes a main unit 1, a retractable unit 2, two elastic elements 3, two constant force springs 4, a flexible display screen 5, and a locking element 6.

The main unit 1 includes a first shell 11, a first supporting plate 12, and an accommodating space 13. The first supporting plate 12 is disposed on the first shell 11. The accommodating space 13 is surrounded and defined by the first supporting plate 12 and the first shell 11. The first shell 11 has a main board 111, a sideboard 112, two slide rail boards 113, and two bases 114. The sideboard 112 and the slide rail board 113 are disposed on the main board 111, and the slide rail boards 113 are correspondingly arranged, and each has a protruding rail 1131 for the retractable unit 2 to slide thereon. Particularly, the first supporting plate 12 is fixed on the main board 111 and defines the accommodating space 13 together with the main board 111, the sideboard 112, and the sliding rail board 113.

Figure 4:
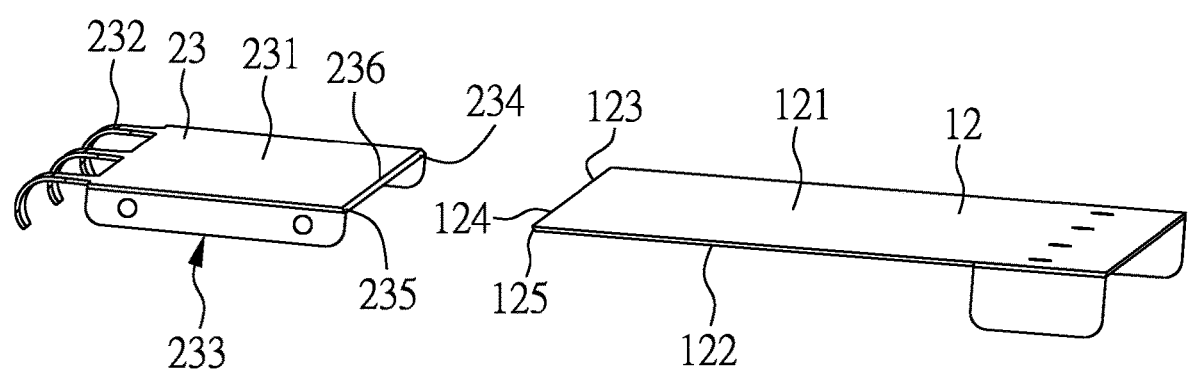
FIG. 4 is a schematic view of the first supporting plate and the second supporting plate according to the present invention.
Figure 5:
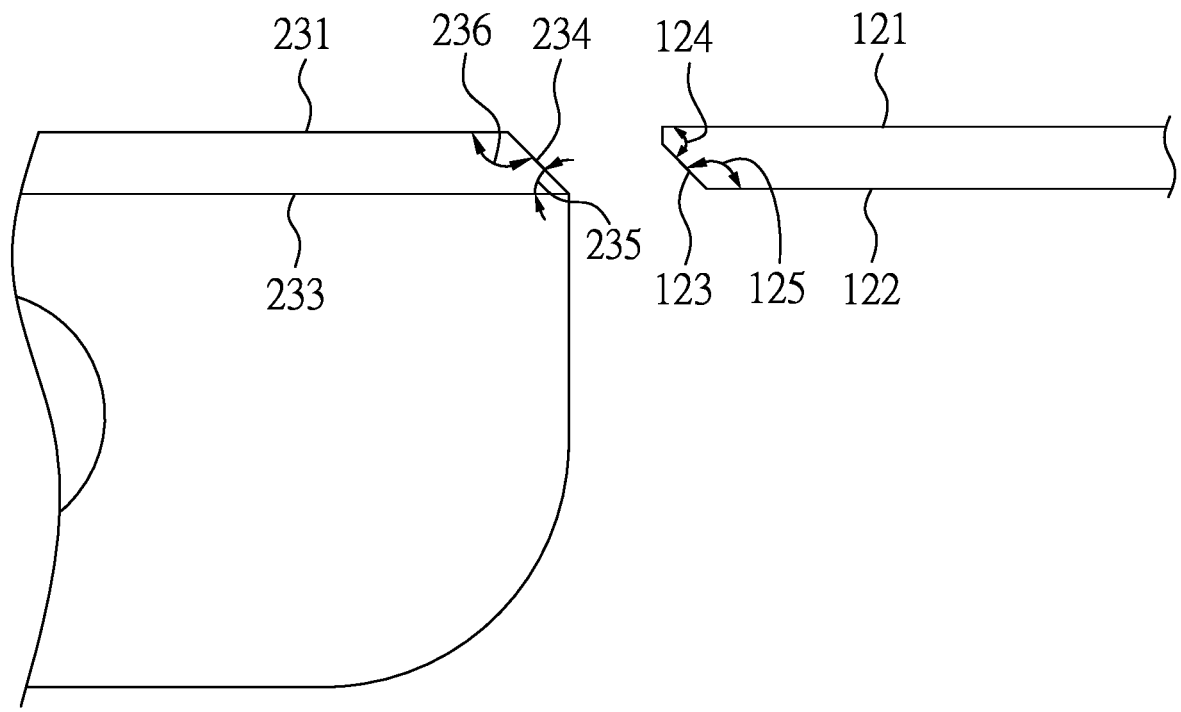
FIG. 5 is a partially enlarged schematic view of the first supporting plate and the second supporting plate according to the present invention.

Specifically, as shown in FIG. 4 and the enlarged view shown in FIG. 5, the first supporting plate 12 has a first supporting surface 121, a first inner surface 122, a first inclined surface 123, a first inner acute angle 124, and a first inner obtuse angle 125, wherein a first inner acute angle 124 is included by the first supporting surface 121 and the first inclined surface 123, and the first inner obtuse angle 125 is included by the first inner surface 122 and the first inclined surface 123.

In addition, the main unit 1 also includes a panel (not shown in figures) electrically connected to the flexible display screen 5, that is, a module of electronic components such as circuit boards or batteries, to provide the corresponding functions of the mobile device. Relevant details are not repeated here.

The retractable unit 2 is disposed on the main unit 1 and can be shifted relative to the main unit 1 along a telescopic axis $A_1$ between a retracted state (FIG. 1) and an extended state (FIG. 2).

Figure 7:
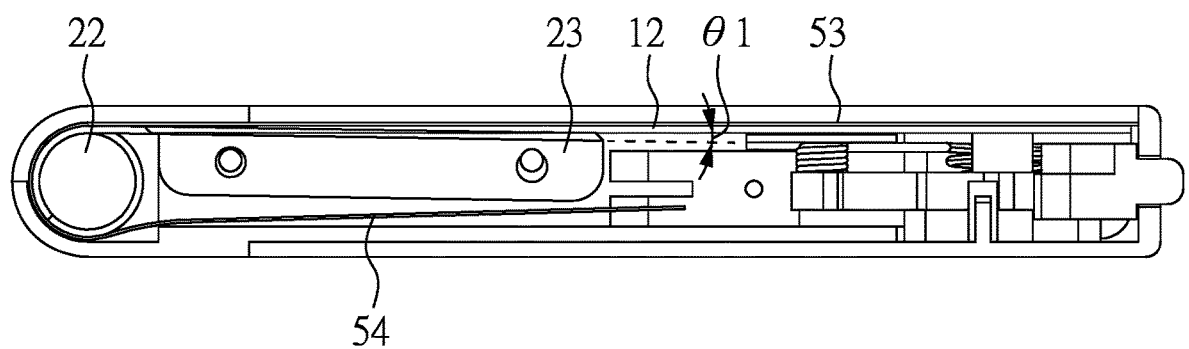
FIG. 7 is a sectional view of the second supporting plate in the inclined position according to the present invention.
Figure 8:
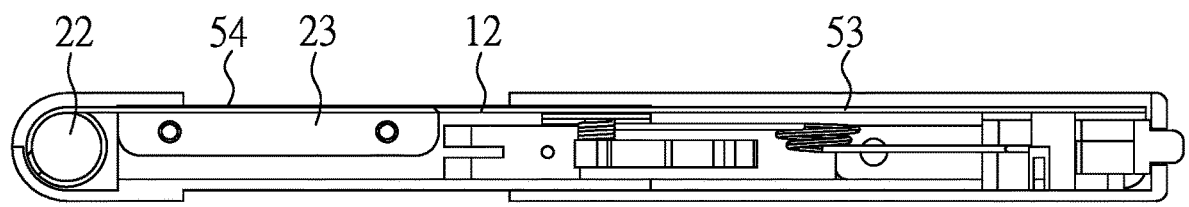
FIG. 8 is a sectional view of the second supporting plate in the aligned position according to the present invention.

Specifically, the retractable unit 2 includes a second shell 21, a pivot 22, a second supporting plate 23, and a connecting plate 24, wherein the second shell 21 has a main body plate 211, an arc-shaped plate 212, and two slider plates 213. The arc-shaped plate 212 is disposed on the side of the main body plate 211 away from the first shell 11 and is used for the pivot 22 to be pivoted thereon. The slider plates 213 are correspondingly disposed on the main body plate 211 and have grooves 2131. The grooves 2131 are slidably assembled with the protruding rails 1131 of the slide rail plate 113, so the second shell 21 can slide relative to the first shell 11 along the telescopic axis $A_1$. The pivot 22 is a damping shaft, two ends of which are pivoted on the arc-shaped plate 212 respectively, and has a shaft 221 and three hook grooves 222. The shaft 221 extends along a steering axis $A_2$, which is substantially perpendicular to the telescopic axis $A_1$. As shown in FIG. 4, the second supporting plate 23 is disposed on the second shell 21 and has a second supporting surface 231, three hook parts 232, a second inner surface 233, a second inclined surface 234, a second inner acute angle 235, and a second inner obtuse angle 236. The hook parts 232 are hung on the pivot 22, so that the second supporting plate 23 can rotate relative to the pivot 22, and can be shifted between an inclined position (FIG. 7) and an aligned position (FIG. 8). The second inner surface 233 is opposite to the second supporting surface 23, the second inclined surface 234 connects the second supporting surface 231 and the second inner surface 233. A second inner obtuse angle 236 is included between the second supporting surface 231 and the second inclined surface 234, and the second inner acute angle 235 is included between the second inner surface 233 and the second inclined surface 234. The first acute inner angle 124 and the second obtuse inner angle 236 are supplementary angles, the first obtuse inner angle 125 and the second acute inner angle 235 are supplementary angles. The connecting plate 24 is disposed on the second shell 21.

Figure 6:
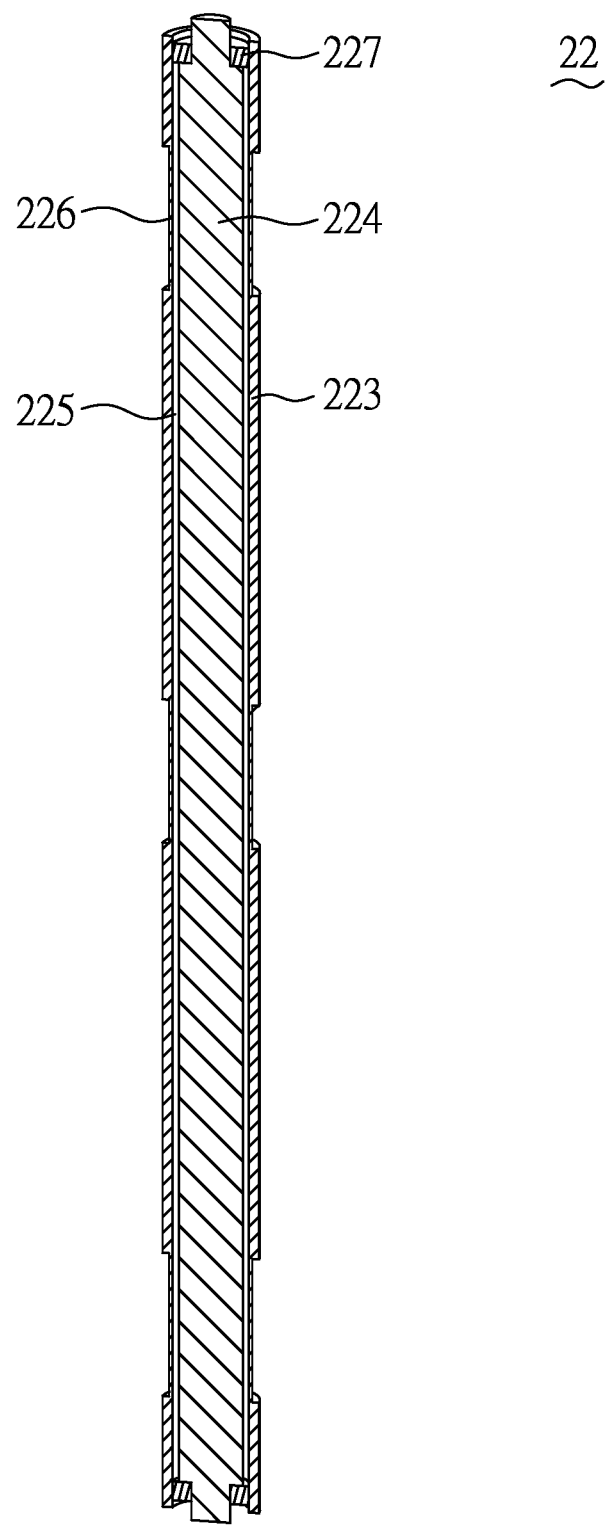
FIG. 6 is a sectional view of the pivot according to the present invention.

Please refer to the sectional view of the pivot 22 shown in FIG. 6, wherein the pivot 22 has a hollow outer tube 223, an inner tube 224, a filling area 225, damping oil 226, and two oil seals 227. The inner tube 224 passes through the hollow outer tube 223, two ends of the inner tube 224 are respectively fixed on the second shell 21, the hollow outer tube 223 rotates relative to the inner tube 224. The filling area 225 is sandwiched between the hollow outer tube 223 and the inner tube 224, the damping oil 226 is filled in the filling area 225, and the two oil seals 227 are respectively disposed at two ends of the filling area 225 for sealing the damping oil 226 in the filling area 225. The damping oil 226 can provide a damping force when the hollow outer tube 223 pivotally rotates relative to the inner tube 224.

Each of the elastic elements 3 is a torsion spring, including a first end 31 and a second end 32. The first end 31 is fixed on the first shell 11 of the main unit 1, and the second end 32 is fixed on the second shell 21 of the retractable unit 2. The elastic element 3 tends to keep the main unit 1 and the retractable unit 2 in the outstretched state.

Each of the constant force springs 4 includes a winding part 41 and a telescopic part 42. The winding part 41 is disposed on the base 114, and the telescopic part 42 is fixed on the flexible display screen 5. The constant force springs 4 provide constant tension on the flexible display screen 5.

Figure 9:
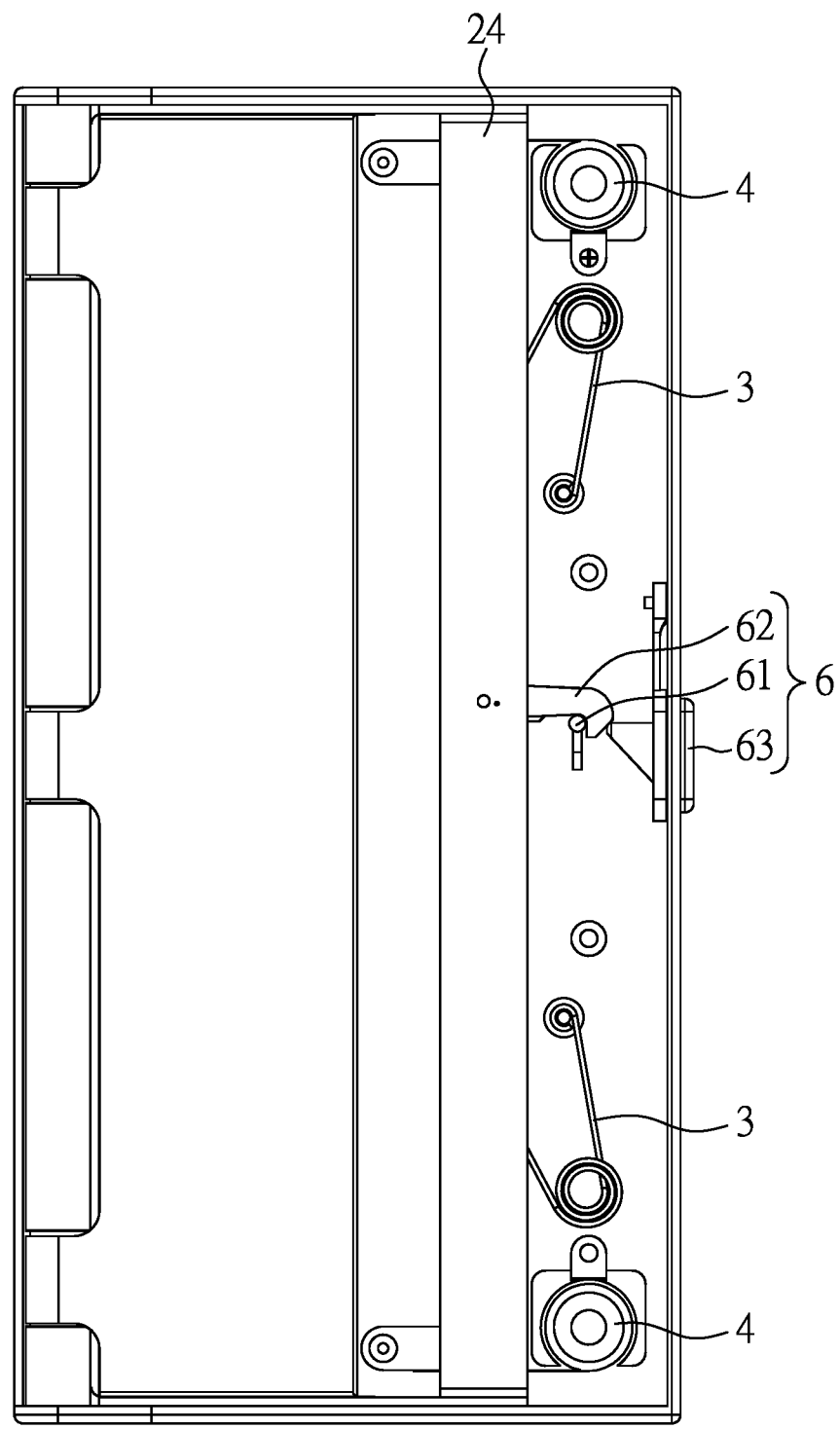
FIG. 9 is a partial schematic view of the locking element in the locked state according to the present invention.
Figure 10:
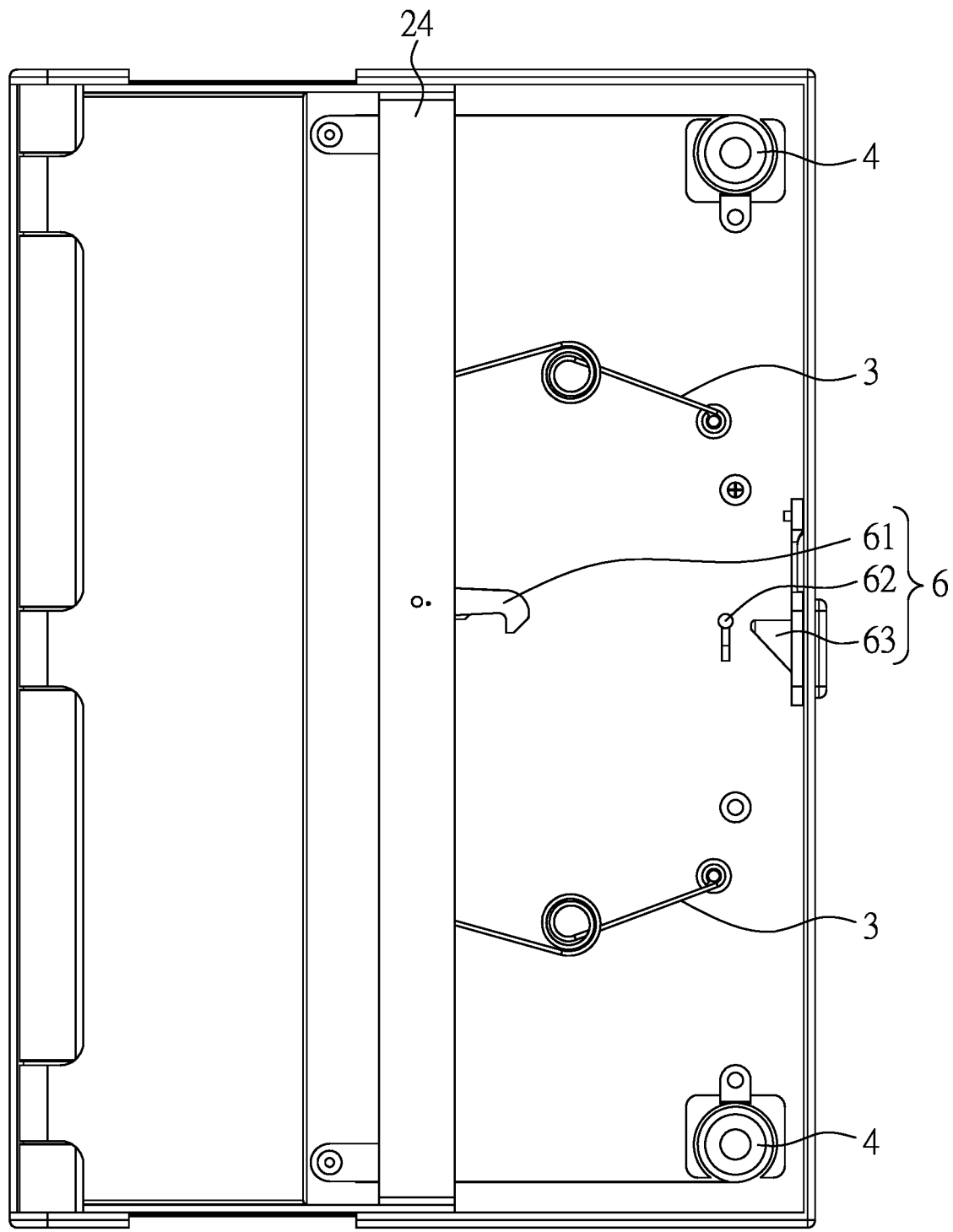
FIG. 10 is a partial schematic view of the locking element in the unlocked state according to the present invention.

The flexible display screen 5 includes a fixed end 51, a free end 52, a fixed display area 53, and an extended display area 54. The fixed end 51 is disposed on the first shell 11 of the first supporting plate 12, and the free end 52 is fixed to the telescopic part 42 of the constant force springs 4. The flexible display screen 5 is tightened to maintain the tension by the constant force springs 4. Please refer to FIG. 9 and FIG. 10, the locking element 6 includes a hook 61, a tenon 62, and a button 63, wherein the hook 61 is disposed on the connecting plate 24, the tenon 62 and the button 63 are disposed on the first shell 11. In a locked state as shown in FIG. 7, the hook 61 and the tenon 62 are engaged with each other (that is, the hook 61 is hooked on the tenon 62). The hook 61 can be pushed by pressing the button 63 to separate the hook 61 from the tenon 62 and switch to an unlocked state as shown in FIG. 8.

Specifically, as shown in FIG. 1 and FIG. 7, when the retractable unit 2 is in the retracted state, the pivot 22 and the first shell 11 are closest to each other. As shown in FIG. 7, the second supporting plate 23 is in the inclined position, wherein the second supporting plate 23 is partially obliquely inserted into the accommodating space 13 and partially overlaps with the first supporting plate 12. The first supporting surface 121 and the second supporting surface 231 are not coplanar to each other. A main angle $\theta_1$ is formed between the first supporting surface 121 and the second supporting surface 231, wherein the main angle $\theta_1$ ranges from 5 to 20 degrees. In the meantime, the fixed display area 53 of the flexible display screen 5 is mainly supported by the first supporting surface 121 (partially supported by the second supporting surface 231), and the extended display area 54 is partially wound around the pivot 22 and is partially accommodated in the accommodating space 13. At this point, the locking element 6 is in the locked state, so that the retractable unit 2 can be maintained in the retracted state.

When the retractable unit 2 is to be converted from the retracted state to the outstretched state to increase the display area of the flexible display screen 5, the user can press the button 63 of the locking element 6 to separate the hook 61 from the tenon 62 and switched to the unlocked state. At this time, the elastic element 3 provides an elastic force to push the second shell 21 to slide along the telescopic axis $A_1$ relative to the first shell 11, and the second supporting plate 23 pivotally rotates relative to the pivot 22 until the pivot 22 and the first shell 11 are farthest away from each other. The second supporting plate 23 shifted from the inclined position (FIG. 7) to the aligned position (FIG. 8), so that the first supporting plate 12 and the second supporting plate 23 do not overlap with each other. The first supporting surface 121 and the second supporting surface 231 are substantially coplanar to each other, and the first inclined surface 123 and the second inclined surface 234 are matched and substantially abutted against each other, to jointly support the flexible display screen 5. When the second shell 21 slides relative to the first shell 11 along the telescopic axis $A_1$, the pivot 22 gradually moves away from the first shell 11, and the pivot 22 drives the extended display area 54 of the flexible display screen 5, which is wound around the pivot 22, to leave the accommodating space 13 and be supported by the second supporting plate 23 until the retractable unit 2 reaches the outstretched state as shown in FIGS. 2, 6, and 8. After the outstretched state is reached, the flexible display screen 5 is jointly supported by the first supporting surface 121 and the second supporting surface 231. Specifically, the fixed display area 53 of the flexible display screen 5 is supported by the first supporting surface 121, a part of the extended display area 54 is supported by the second supporting surface 231, and a part of the extended display area 54 is wound around the pivot 22. At this point, the area of the flexible display screen 5 that the user can use is increased.

When the retractable unit 2 is to be converted from the outstretched state to the retracted state for restoring the display area of the flexible display screen 5, the user can force the pivot 22 to move along the direction toward the main unit 1 for resist the elastic force provided by the elastic elements 3. Accordingly, the second shell 21 may slide along the telescopic axis $A_1$ toward the first shell 11. At this time, the second inclined surface 234 of the second supporting plate 23 pivotally rotates relative to the pivot 22 after contacting the first inclined surface 123 of the first supporting plate 11, and shifted from the aligned position (FIG. 8) to the inclined position (FIG. 7), and gradually overlaps with the first supporting plate 12. Due to the force provided by the constant force spring 4, the extended display area 54 of the flexible display screen 5 is pulled into the accommodating space 13 until the hook 61 and the tenon 62 of the locking element 6 are engaged with each other, the retractable unit 2 returns to the retracted state.

Since the pivot 22 is a damping shaft, the pivot 22 provides the damping force to prevent the retractable unit 2 from moving too fast relative to the main unit 1 which may cause damage to the components when the retractable unit 2 slides back and forth relative to the main unit 1. Also, it can provide a harmonious and smooth operating feel to improve the quality and value of the product for the user. However, the pivot 22 is not limited to the damping shaft and may also be a rotating shaft that generally has no damping effect. In addition, if the pivot 22 is a general rotating shaft without a damping effect, a damping rod (not shown) can be arranged along the telescopic axis $A_1$ to abut between the first shell 11 and the second shell 21 to provide the damping effect.

Although the present invention has been described in considerable detail with reference to certain embodiments thereof, other embodiments are possible. Therefore, the spirit and scope of the appended claims should not be limited to the description of the embodiments contained herein.

What is claimed is:

1. A retractable screen mobile device, comprising:
   a main unit, including a first shell, a first supporting plate, and an accommodating space, wherein the first supporting plate is disposed on the first shell and has a first supporting surface, and the accommodating space is surrounded and defined by the first shell and the first supporting plate;
   a retractable unit, slidably disposed on the main unit along a telescopic axis and changing between a retracted state and an outstretched state with respect to the main unit, and including a second shell, a pivot, and a second supporting plate, wherein the pivot is disposed on one side of the second shell away from the first shell, the second supporting plate is pivotably hung on the pivot and has a second supporting surface, and the second supporting plate is able to be switched between an inclined position and an aligned position with respect to the pivot;
   an elastic element with two ends separately disposed on the main unit and the retractable unit;
   a constant force spring, including a winding part and a telescopic part, wherein the winding part is disposed on the first shell; and
   a flexible display screen, including a fixed end and a free end, wherein the fixed end is disposed on the first supporting plate, the flexible display screen covers the first supporting surface and is wound around the pivot, the free end is fixed to the telescopic part of the constant force spring, and the constant force spring provides constant tension on the flexible display screen;
   wherein the pivot and the first shell are closest to each other when the retractable unit is in the retracted state, and the pivot and the first shell are farthest away from each other when the retractable unit is in the outstretched state.

2. The retractable screen mobile device claimed in claim 1, wherein when the retractable unit is in the retracted state, the second supporting plate is in the inclined position, partially obliquely inserted in the accommodating space and partially overlapped with the first supporting plate, the first supporting surface and the second supporting surface are not coplanar, the flexible display screen is mainly supported by the first supporting surface; and wherein when the retractable unit is in the outstretched state, the first supporting plate and the second supporting plate do not overlap to each other, the first supporting surface and the second supporting surface substantially coplanar, and the flexible display screen is jointly supported by the first supporting surface and the second supporting surface.

3. The retractable screen mobile device claimed in claim 2, wherein the first supporting plate further has a first inner surface and a first inclined surface, wherein the first inner surface is opposite to the first supporting surface, and the first inclined surface connects the first supporting surface and the first inner surface, wherein the second supporting plate has at least a hook part, a second inner surface, and a second inclined surface, wherein the hook part is hung on the pivot so that the second supporting plate can rotate relative to the pivot, the second inner surface is opposite to the second supporting surface, and the second inclined surface connects the second supporting surface and the second inner surface, and wherein the first inclined surface and the second inclined surface are matched and substantially abutted with each other when the retractable unit is in the outstretched state.

4. The retractable screen mobile device claimed in claim 3, wherein a first inner acute angle is formed between the first supporting surface and the first inclined surface, a first inner obtuse angle is formed between the first inner surface and the first inclined surface, a second inner obtuse angle is formed between the second supporting surface and the second inclined surface, and a second inner acute angle is formed between the second inner surface and the second inclined surface.

5. The retractable screen mobile device claimed in claim 4, wherein the elastic element includes a first end and a second end, wherein the first end is fixed to the first shell, the second end is fixed to the retractable unit, and tends to keep the retractable unit in the outstretched state.

6. The retractable screen mobile device claimed in claim 5, wherein the flexible display screen includes a fixed display area and an extended display area, wherein the fixed display area is constantly supported by the first supporting surface, the extended display area is partially supported by the second supporting surface and partially wound around the pivot when the retractable unit is in the outstretched state, and the extended display area is partially wound around the pivot and partially accommodated in the accommodating space when the retractable unit is in the retracted state.

7. The retractable screen mobile device claimed in claim 6, further comprising a locking element, wherein when the locking element is in a locked state, the retractable unit is kept in the retracted state, and when the locking element is in an unlocked state, the elastic element pushes the retractable unit so that the retractable unit tends to remain in the outstretched state.

8. The retractable screen mobile device claimed in claim 7, wherein the locking element includes a hook, a tenon and a button, wherein the hook is attached to the second shell, the tenon and the button are disposed on the first shell; and wherein the hook and the tenon are engaged with each other in the locked state, and the hook and the tenon are separated and switched to the unlocked state when the button is pressed.

9. The retractable screen mobile device claimed in claim 8, wherein the pivot has a rod body and at least one hook groove, the rod body extends along a steering axis substantially perpendicular to the telescopic axis, and the at least one hook groove is formed on the rod body and the hook part is correspondingly hung on the at least one hook groove.

10. The retractable screen mobile device claimed in claim 9, wherein a main angle is formed between the first supporting surface and the second supporting surface when the second supporting plate is in the inclined position, and wherein the main angle ranges from 5 to 20 degrees.

11. The retractable screen mobile device claimed in claim 10, wherein the elastic element is a torsion spring with two ends respectively disposed on the first shell and the second shell.

12. The retractable screen mobile device claimed in claim 1, wherein the pivot is a damping shaft that provides a damping force when the retractable unit moves relative to the main unit.

13. The retractable screen mobile device claimed in claim 12, wherein the damping shaft has a hollow outer tube, an inner tube, a filling area, a damping oil, and two oil seals, wherein the inner tube passes through the hollow outer tube and two ends of the inner tube are respectively fixed on the second shell, the hollow outer tube rotates relative to the inner tube, the filling area is sandwiched between the hollow outer tube and the inner tube, the damping oil is filled in the filling area, and the two oil seals are respectively disposed at both ends of the filling area to seal the damping oil in the filling area.

\* \* \* \* \*